United States Patent
Muruyama

(10) Patent No.: US 6,803,729 B2
(45) Date of Patent: Oct. 12, 2004

(54) DRIVE CIRCUIT FOR ORGANIC EL DEVICE

(75) Inventor: Junichi Muruyama, Niigata (JP)

(73) Assignee: Nippon Seiki Co., Ltd., Niigata (JP)

(*) Notice: Subject to any disclaimer, the term of this patent is extended or adjusted under 35 U.S.C. 154(b) by 0 days.

(21) Appl. No.: 10/250,931

(22) PCT Filed: Apr. 12, 2002

(86) PCT No.: PCT/JP02/03704
§ 371 (c)(1),
(2), (4) Date: Jul. 9, 2003

(87) PCT Pub. No.: WO03/046876
PCT Pub. Date: Jun. 5, 2003

(65) Prior Publication Data
US 2004/0047143 A1 Mar. 11, 2004

(30) Foreign Application Priority Data
Nov. 27, 2001 (JP) ........................... 2001-360597

(51) Int. Cl.$^7$ ................................................ G09G 3/32
(52) U.S. Cl. ................ 315/169.1; 315/169.3; 345/82; 345/206
(58) Field of Search .................. 315/169.1, 169.3; 345/82, 206

(56) References Cited

U.S. PATENT DOCUMENTS 5,844,368 A    12/1998  Okuda et al.
6,157,356 A  * 12/2000  Troutman ...................... 345/82
6,229,508 B1 *  5/2001  Kane ............................. 345/82

FOREIGN PATENT DOCUMENTS

| EP | 0 732 868 A1 | 9/1996 |
|----|---|---|
| JP | 03-110788 | 5/1991 |
| JP | 04-308687 | 10/1992 |
| JP | 08-32307 | 4/1994 |
| JP | 09-232074 | 9/1997 |
| JP | P3102411 | 8/2000 |
| JP | 2001-56668 A | 2/2001 |

* cited by examiner

Primary Examiner—David Vu
(74) Attorney, Agent, or Firm—McDermott Will & Emery LLP

(57) ABSTRACT

It is an object of the present invention to provide a drive circuit for an organic light emitting diode which can suppress a fall in an intensity of light emission to extend the life of the organic light emitting diode. The present invention is a drive circuit for an organic light emitting diode which has plural anodes A1 to A3 and plural cathodes B1 to B4 intersecting while being opposed to each other and an organic layer having at least a light-emitting layer intervening between both the poles, sets one of both the poles as drive lines and the other of both the poles as scanning lines, and by scanning all of these scanning lines as one field at a predetermined frequency, presents light emission with the intersection portions as pixels E11 to E34. Capacitors C11 to C34 having a predetermined added capacity, to which a bias voltage Vr in a direction of canceling charges to be charged to a parasitic capacity of the pixels E11 to E34 is applied, are provided.

6 Claims, 3 Drawing Sheets

DRIVE CIRCUIT FOR ORGANIC EL DEVICE

TECHNICAL FIELD

The present invention relates to a drive circuit for an organic light emitting diode (OLED).

BACKGROUND ART

An OLED having a light-emitting layer consisting of an organic compound has been attracting attentions as a device realizing DC low voltage drive. For example, JP-A-6-32307 discloses a structure in which a nodes consisting of a translucent film of an indium tin oxide (ITO) are formed on an upper surface of a substrate consisting of a translucent glass, a hole injection layer, a light-emitting layer, and cathodes consisting of a film of aluminum (Al) are sequentially formed on the anode, and a power supply is connected between the anodes and the cathodes, whereby positive holes generated in the anodes are transmitted to an interface between the hole injection layer and the light-emitting layer, where the positive holes are combined with electrons transmitted from the cathodes to emit a visible ray.

There are known an OLED for performing so-called passive matrix display in which, in the above OLED, the anodes and the cathodes are formed in a plural strip shapes, respectively, and the anodes and the cathodes are arranged in a lattice shape, and one of the anodes and the cathodes are sequentially selected and scanned at a constant time interval with each intersection position of the anodes and the cathodes arranged in the lattice shape as a light emission portion (pixel) and, at the same time, the other of the anodes and the cathodes are driven by a DC constant current circuit serving as a drive source, whereby an arbitrary pixel is caused to emit light, and a driver circuit for the OLED.

Such an OLED has a problem in that, in a long-term use, chargers are accumulated in an intersection between the hole injection layer and the light-emitting layer, whereby a light emission luminance in the pixel falls.

As a technique for solving such a problem, for example, JP-A-9-232074 discloses, as a drive circuit (method) for performing the passive matrix display, a technique with which, at the time of switching to the next scanning line (cathode), all the scanning lines are once connected to a reset voltage zero volt (or power supply voltage) consisting of the same potential for a predetermined time (reset time), whereby a parasitic capacity of the pixels, which should be caused to emit light, is charged by the drive source via drive lines (the anodes) and, at the same time, also charged by a reverse bias voltage of the scanning lines through the parasitic capacity of the pixels, which are not caused to emit light and, consequently, since voltages at both ends of the pixels which should be caused to emit light instantly rise to a potential allowing light emission, the pixels can emit light instantly.

However, connecting all the scanning lines to the reset voltage consisting of the same potential once at the time of switching to the next scanning line makes an operation complex and causes enlargement and complication of a drive circuit. In addition, since the power supply voltage is applied to the unselected scanning lines, an invalid charging current, which does not contribute to light emission, flows to the drive lines via the pixels to increase a consumed current. Further, since all the pixels including the pixels, which should be caused to emit light, are turned off during the reset time, a light emission time is relatively reduced to cause a fall in the light emission luminance. In order to compensate for the fall, a peak luminance should be made higher than usual, which facilitates a luminance fall characteristic to shorten the life of the OLED.

In addition, for example, Japanese Patent No. 3102411 discloses a technique with which a charging circuit for charging the parasitic capacity (junction capacity) to a predetermined potential at the time of rising of drive of the OLED with an output of a pulse generator is provided in constant current drive means for driving the OLED, whereby the junction capacity can be charged in a predetermined time (charging time) and, the OLED is driven without delaying the rising of a pulse, a fall in the light emission luminance can be suppressed.

However, in the correction by the charging circuit, since charges to be cancelled depend upon "current×time" or "voltage×time", setting of a current value, a voltage value, and a time, which are control parameters therefor, is difficult. In addition, by providing the charging time, since all the pixels come into a non-light emission state during that time, and all the pixels including the pixels which should be caused to emit light are turned off, a light emission time is relatively reduced to cause a fall in the light emission luminance. In order to compensate for the fall, a peak luminance should be made higher than usual, which facilitates a luminance fall characteristic to shorten the life of the OLED.

The present invention has been devised in view of such points, and it is an object of the present invention to provide a drive circuit which, through application to an OLED for performing the so-called passive matrix display, can extend the life of the OLED with a simple configuration.

DISCLOSURE OF THE INVENTION

The present invention is a drive circuit for an organic light-emitting diode which has anodes and cathodes opposed to each other and an organic layer having at least a light-emitting layer intervening between both the poles, and presents light emission with the opposed portions as pixels, in which capacitors having a predetermined added capacity, to which a bias voltage is applied in a direction of canceling charges to be charged to a parasitic capacity of the pixels, are provided.

In addition, the present invention is a drive circuit for an organic light emitting diode which has plural anodes and plural cathodes intersecting while being opposed to each other and an organic layer having at least a light-emitting layer intervening between both the poles, sets one of both the poles as drive lines and the other of both the poles as scanning lines, and by scanning all of these scanning lines as one field at a predetermined frequency, while sequentially bringing any one of the scanning lines into a selected state, in synchronization with this, connects a drive source to the other of the scanning lines to thereby present light emission with the intersection portions as pixels, in which capacitors having a predetermined added capacity, to which a bias voltage is applied in a direction of canceling charges to be charged to a parasitic capacity of the pixels, are provided.

Further, the present invention is a drive circuit for an organic light emitting diode which has plural anodes and plural cathodes intersecting while being opposed to each other and an organic layer having at least a light-emitting layer intervening between both the poles, sets one of both the poles as drive lines and the other of both the poles as scanning lines, has a partition for insulating the scanning lines from each other with a dielectric material on at least one of both the poles, and by scanning all of these scanning lines as one field at a predetermined frequency, while sequentially bringing any one of the scanning lines into a selected state, in synchronization with this, connects a drive source to the other of the scanning lines to thereby present light emission with the intersection portions as pixels, in which capacitors having a predetermined added capacity, to which a bias voltage is applied in a direction of canceling charges to be charged to a parasitic capacity of the pixels between a conductor film formed on the partition and the one of both the poles, are provided.

In particular, the conductor film is connected to a bias circuit which is commonly connected to supply the bias voltage.

In particular, the sum of the added capacity is equal to or more than the parasitic capacity.

In particular, the drive source performs a DC current or DC voltage drive, and the bias voltage is a DC voltage.

BEST MODE FOR CARRYING OUT THE INVENTION

The present invention will be described based upon an embodiment shown in the accompanying drawings.

Figure 1:
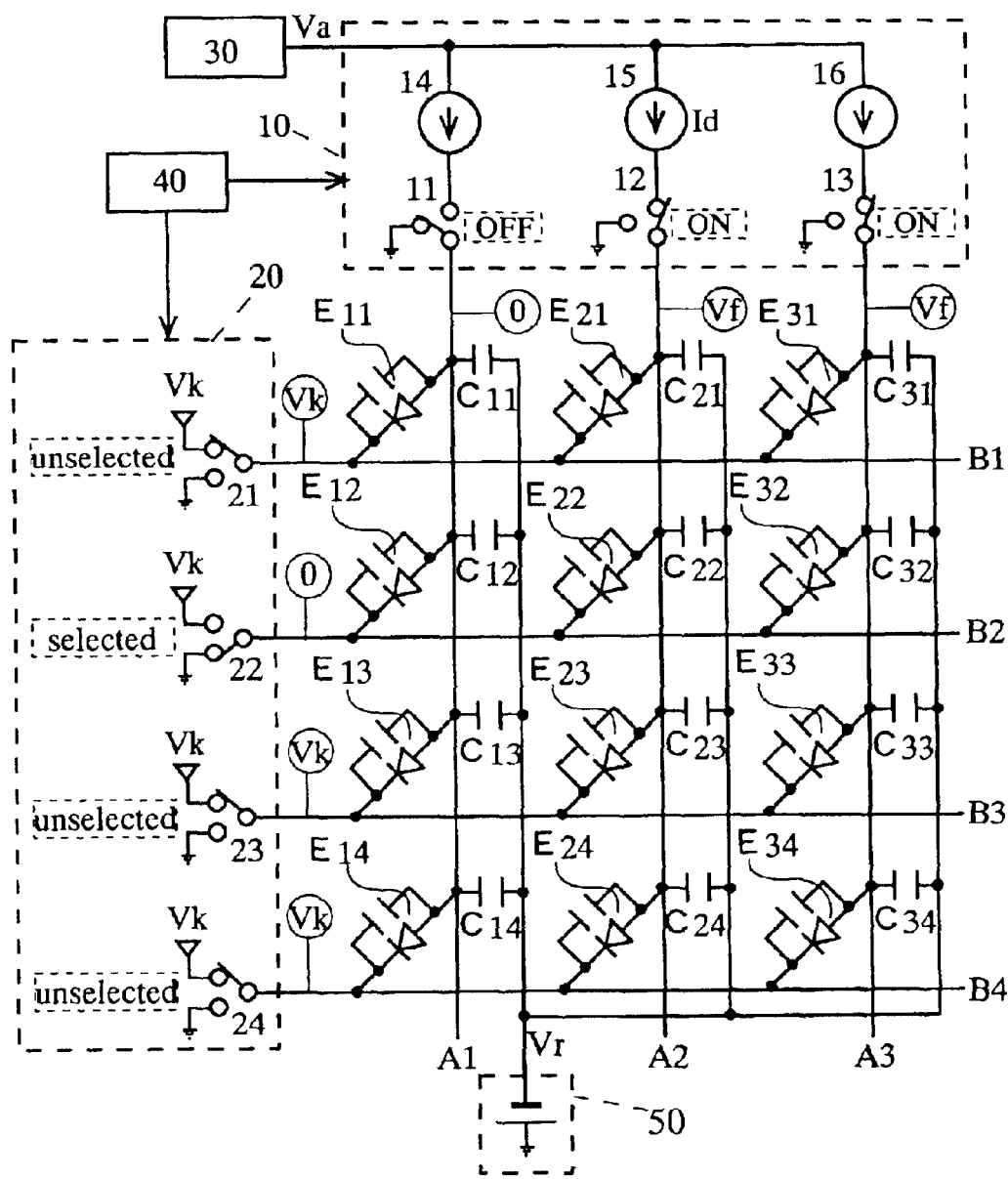
FIG. 1 is a circuit diagram of an embodiment of the present invention.
Figure 2:
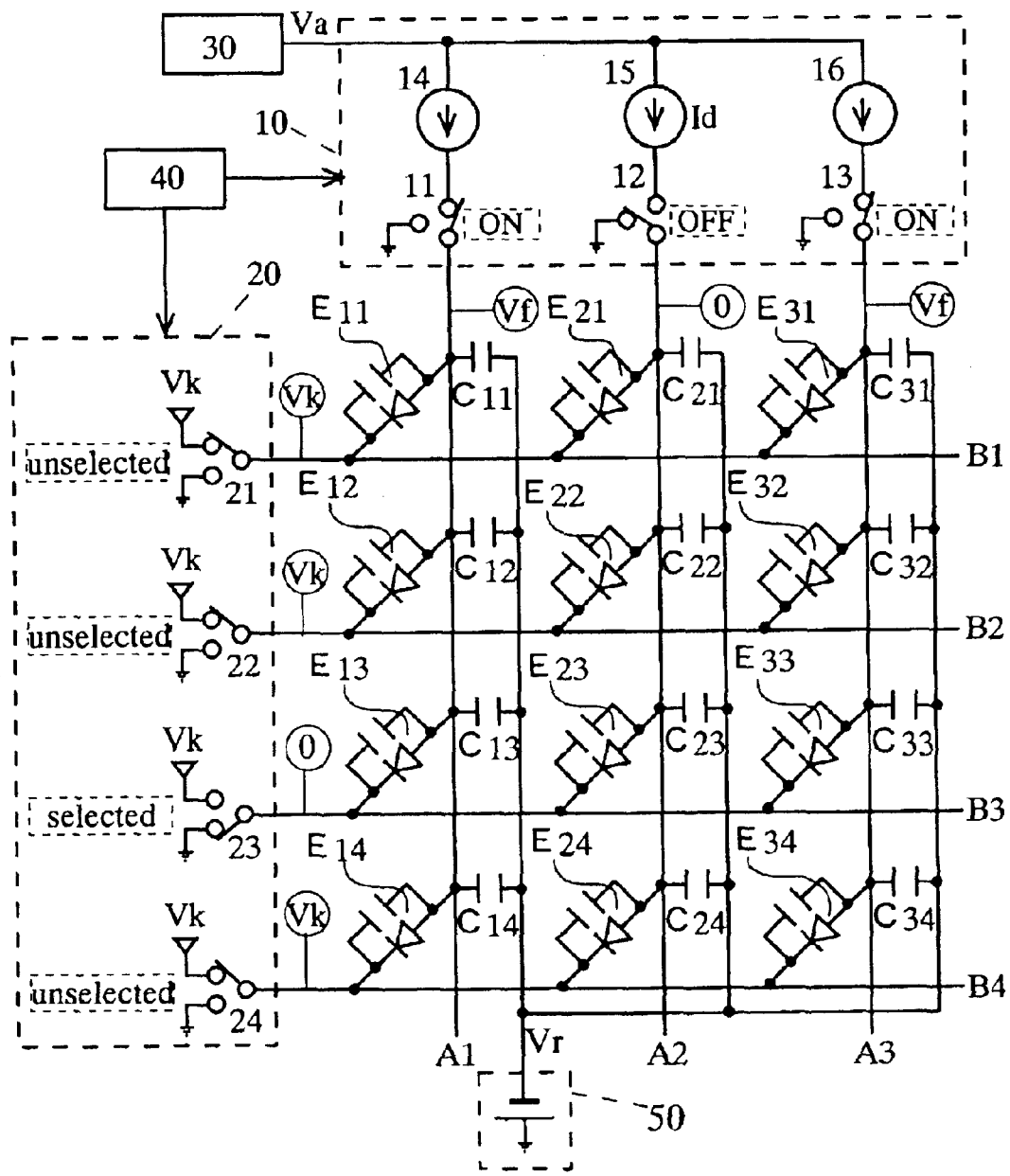
FIG. 2 is a circuit diagram of the same.

FIGS. 1 and 2 are a drive circuit in accordance with the embodiment and show the case in which the drive circuit has row (horizontal direction)×column (vertical direction)=3× 4=12 pixels. For example, in the case in which such an OLED is used as a display device for displaying numbers of an odometer, a clock, and the like of a vehicle in one row, the number of rows is determined according to the number of digits to be displayed, and about sixteen columns are necessary.

Reference symbols A1 to A3 denote anodes, B1 to B4 denote cathodes, and E11 to E34 denote pixels which are located at intersections of the anodes A1 to A3 and the cathodes B1 to B4 and present light emission. The respective pixels E11 to E34 are represented by equivalent circuits of a light-emitting element consisting of a diode characteristic and a parasitic capacity connected to this in parallel. However, in the following description and the drawings, assuming that characteristics of the pixels E11 to E34 are equal, the parasitic capacity of an arbitrary pixel Exx is assumed to be Cel. Then, a drive circuit 10 is connected to the anodes A1 to A3, and a scanning circuit 20 is connected to the cathodes B1 to B4.

A drive voltage circuit 30 for outputting a drive voltage Va is connected to the drive circuit 10. The drive circuit 10 has switches 11 to 13 for selecting the anodes A1 to A3 between the drive circuit 10 and the anodes A1 to A3 and, by turning "ON" these switches 11 to 13, connects DC constant current circuits 14 to 16 serving as drive sources for drive to the anodes A1 to A3.

The scanning circuit 20 has switches 21 to 24 for sequentially scanning the respective cathodes B1 to B4 as scanning lines, and one ends of the respective switches 21 to 24 are connected to a reverse voltage terminal to which a cutoff voltage Vk volt supplied from a drive voltage circuit 30 is applied and the other ends thereof are connected to a ground terminal of zero volt, and these switches 21 to 24 are changed over to the reverse voltage terminal (unselected) and the ground terminal (selected) in order.

Then, the drive circuit 10 and the scanning circuit 20 are controlled by a display control circuit 40. Note that, in the figure, in the switches 11 to 13 of the drive circuit 10, the case in which a current Id is applied to any of the pixels E11 to E34 by the current circuits 14 to 16 is represented as "ON" and the case in which the current Id is no applied is represented as "OFF". In addition, in the switches 21 to 24 of the scanning circuit 20, the case in which the switches 21 to 24 are connected to an anode being scanned among the anodes B1 to B4 is represented as "selected" and the case in which the switches 21 to 24 are connected to an anode not being scanned is represented as "unselected". Consequently, only the pixels, for which the drive circuit 10 is "ON" and the scanning circuit 20 is "selected", among the pixels E11 to E34 emit light.

One ends of capacitors C11 to C34 are connected to each connection point of the pixels E11 to E34 and the anodes A1 to A3, respectively, and the other ends of these capacitors C11 to C34 are collectively connected to a bias circuit 50. This bias circuit 50 supplies a bias voltage Vr (=Vk,>Vf) volt to the capacitors C11 to C34. Note that an arbitrary capacitor Cxx is selected and connected so as to have an added capacity Cr equal to or more than the parasitic capacity Cel of the pixel Exx to which the one end thereof is connected. However, as described above, if characteristics of the pixels E11 to E34 are equal (i.e., the parasitic capacity Cel is the same in all the pixels E11 to E34), only there is one kind of the added capacity Cr.

Control of light emission by such a drive circuit will be described. In the following description, the case in which, after scanning the cathode B2 as a scanning line to cause the pixels E22, E32 to emit light, the cathode B3 is scanned to cause the pixels E13, E33 to emit light will be described.

In order to scan the cathode B2 to cause the pixels E22, E32 to emit light, as shown in FIG. 1, the switch 22 of the scanning circuit 20 is changed over to the ground terminal, which is the selected side, and the cathode B2 is scanned. The other switches 21, 23, 24 are changed over to the reverse voltage terminal which is the unselected side. Therefore, a potential on the pixel side of the scanning circuit 20 is zero volt for the switch 22 and Vk volt for the other switches.

Current circuits 15, 16 are connected to the anodes A2, A3 by the switches 12, 13 of the drive circuit 10, but the other switch 11 is connected to the ground terminal. Therefore, a potential on the pixel side of the drive circuit 10 is Vf volt, which is a predetermined potential, for the switches 12, 13 and is zero volt for the other switch.

At this point, only the pixels E22, E32, for which the drive circuit 10 is "ON" and the scanning circuit 20 is "selected", are biased in a forward direction, the drive current Id is flowing to the pixels E22, E32 from the current circuits 15, 16, and a charge Qon to be charged to these pixels E22, E32 is Cel×Vf>0.

A charge Qoff1 to be charged to the other pixel E12, for which the scanning circuit 20 is "selected", is zero, the charges Qon and Qoff have a relation of Qon>Qoff, and the pixel E12 does not emit light and a current does not flow to the pixel E12.

A charge Qoff2 to be charged to the pixels E21, E23, E24, E31, E33, E34, for which the drive circuit 10 is "ON" and the scanning circuit 20 is "unselected", is Cel×(Vk−Vf)<0.

That is, since Vk and Vf have opposite polarities, a difference between them is low compared with Vf, the charges Qon and Qoff2 have a relation of Qon>Qoff2, and the pixel Exx with the charge Qoff2 does not emit light and almost no current flows to the pixel Exx.

A charge Qoff3 to be charged to the pixels E11, E13, E14, for which the drive circuit 10 is "OFF" and the scanning circuit 20 is "unselected", is Cel×Vk<0. That is, since Vk and Vf have opposite polarities, the charges Qon and Qoff3 have a relation of Qon>Qoff3, and the pixel Exx with the charge Qoff3 does not emit light and almost no current flows to the pixel Exx.

A charge Qc1 to be charged to the capacitors C21 to C24, C31 to C34 connected to the pixel Exx, for which the drive circuit 10 is "ON", is Cr×(Vr−Vf)>0. This is because Vk and Vf are set to the same polarity.

A charge Qc2 to be charged to the capacitors C11 to C14 connected to the pixel Exx, for which the drive circuit 10 is "OFF", is Cr×Vr>0. This is because Vk and Vf are set to the same polarity.

Next, in order to scan the cathode B3 to cause the pixels E13, E33 to emit light, as shown in FIG. 2, the switch 23 of the scanning circuit 20 is changed over to the ground terminal, which is the selected side, and the cathode B3 is scanned. The other switches 21, 22, 24 are changed over to the reverse voltage terminal which is the unselected side. Therefore, a potential on the pixel side of the scanning circuit 20 is zero volt for the switch 23 and Vk volt for the other switches.

Current circuits 14, 16 are connected to the anodes A1, A3 by the switches 11, 13 of the drive circuit 10, but the other switch 12 is connected to the ground terminal. Therefore, a potential on the pixel side of the drive circuit 10 is Vf volt, which is a predetermined potential, for the switches 11, 13 and is zero volt for the other switch.

At this point, only the pixels E13, E33, for which the drive circuit 10 is "ON" and the scanning circuit 20 is "selected", are biased in a forward direction, the drive current Id is flowing to the pixels E13, E33 from the current circuits 14, 16, and a charge Qon to be charged to these pixels E13, E33 is Cel×Vf. On the other hand, the charge Qoff of the other pixel Exx is as described above (see Qoff1 to Qoff3), the charges Qon and Qoff have a relation of Qon>Qoff, and the other pixel Exx with the charge Qoff does not emit light.

In addition, the charge Qc1 to be charged to the capacitors C1n, C3n (n=1 to 4, same in the following description) and the charge Qc2 of the capacitor C2n are also as described above.

When shifting from FIG. 1 to FIG. 2, the charge Qoff3 charged to the pixels E11, E13, E14 is cancelled by the charge Qc2 charged to the capacitors C11, C13, C14 due to a relation of Qoff3=Qc2.

Similarly, the charge Qoff2 charged to the pixels E31, E33, E34 is cancelled by the charge Qc1 charged to the capacitors C31, C33, C34 due to a relation of Qoff2=Qc1.

On the other hand, the charge charged to the pixel E2n and the capacitor C2n connected to the same is discharged because the switch 12 is grounded.

Note that, since the charge Qoff1 charged to the pixel E12 is zero, there is no movement of charge in the switching from FIG. 1 to FIG. 2, and the charge Qc2 charged to the capacitor C12 connected to the pixel E12 does not change.

In addition, in the pixel E32, although the charge falls from the charge Qon (FIG. 1) to the charge Qoff2 (FIG. 2), since the capacitor C32 connected to the pixel E32 tries to keep the charge Qc1 thereof constant, an excess charge Qon−Qoff2 moves from the pixel E33 connected to the ground terminal via the switch 23.

In this way, in the pixel Exx and the capacitor Cxx connected to the pixel Exx, the charge charged to the pixel Exx (in the above-mentioned example, pixels E11, E13, E14, E31, E33, E34) can be cancelled, and deterioration due to the charge can be improved.

In addition, in the case in which the pixel Exx (in the above-mentioned example, the pixel E32) changing from light emission to non-light emission and the pixel Exx (in the above-mentioned example, the pixel E33) changing from non-light emission to light emission are connected to the identical line (in the above-mentioned example, the anode A3) of the drive circuit 10, since an excessive charge thereof moves from the former pixel to the latter pixel, injection of charges into the latter pixel is performed with high efficiency in a short time, rising of light emission becomes steep.

In the case in which the pixel Exx shifts from non-light emission to light emission, that is, in a process in which a potential on the drive circuit 10 side rises from zero volt to Vf volt, assuming that a voltage rise is ΔV, a charge not contributing to light emission of the pixel Exx=Cel×ΔV and a charge of the capacitor Cxx connected to the pixel Exx= Cr×ΔV, which are accumulated according to the parasitic capacity Cel and the added capacity Cr, are cancelled each other because the voltage rise ΔV is equal.

For this purpose, the charge which is accumulated in the pixel Exx and does not contribute to light emission and the charge accumulated in the capacitor Cxx connected to the pixel Exx are required to have opposite polarities and the latter charge is required to be set larger than the former charge in order to completely eliminate the former charge. Consequently, Cel≦Cr is desirable.

Note that, although the example in which the DC constant current circuits 14 to 16 are used as drive sources is described in FIGS. 1 and 2, the present invention can be realized in the same manner as describe above even if a DC constant voltage circuit is used. In any case, if a drive source is a DC drive source, it is desirable that the bias voltage Vr is a DC voltage in order to charge the added capacity Cr of the capacitor Cxx for canceling a charge to be charged to the parasitic capacity Cel of the pixel Exx.

Next, a specific forming method of the capacitor Cxx will be described.

Figure 3:
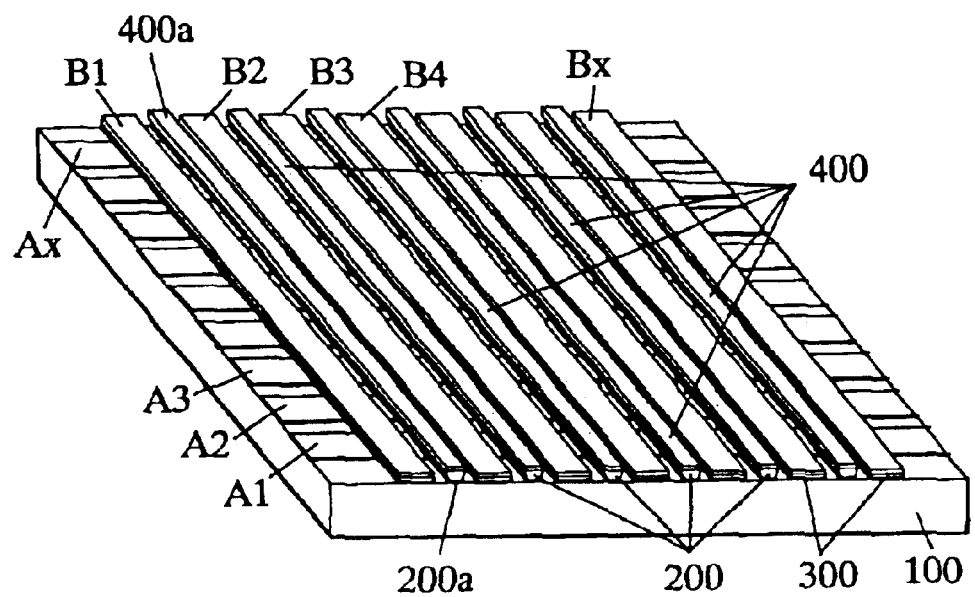
FIG. 3 is a main part schematic perspective view of the embodiment of the present invention.
Figure 4:
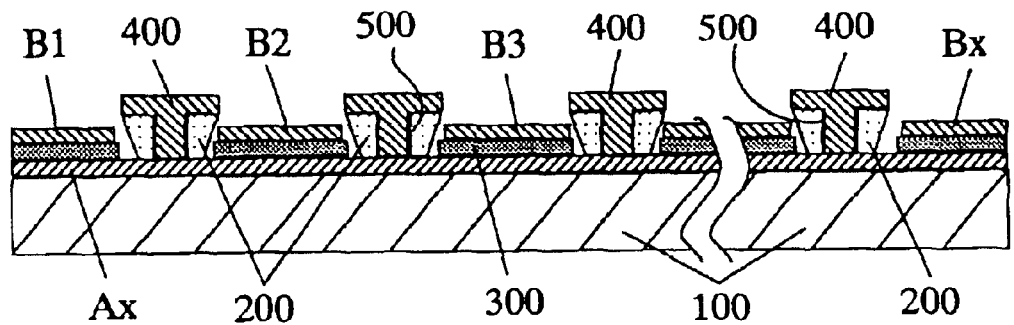
FIG. 4 is a same main part schematic sectional view of the same.

As a structure of an OLED for performing so-called passive matrix display, for example, JP-A-8-315981 discloses, as shown in FIGS. 3 and 4, an OLED which consists of a substrate 100 having anodes A1, A2, A3 . . . Ax serving as plural first display electrodes formed on a surface thereof, plural electrical insulating partitions 200 projecting above the substrate 100 which causes at least a part of the anodes A1, A2, A3 . . . Ax, at least a single layer of thin film 300 of an organic EL medium formed on the exposed parts of the anodes A1, A2, A3 . . . Ax, respectively, and cathodes B1, B2, B3, B4 . . . Bx serving as plural second display electrodes formed on this thin film 300.

In such a structure, in forming the cathodes B1, B2, B3, B4 . . . Bx, a material of the cathodes B1, B2, B3, B4 . . . Bx, for example, aluminum are evaporated on the partition 200, whereby a conductor film 400 consisting of the same material as the cathodes B1, B2, B3, B4 . . . Bx is also formed on the partition 200.

Here, a dielectric is used as a material forming the partition 200, at least one of the anodes A1, A2, A3 . . . Ax (e.g., last Ax) is set as a connection line connected to the bias circuit 50 shown in FIGS. 1 and 2 not contributing to display, and the conductor film 400 is electrically connected to this.

More specifically, as shown in FIG. 4, in forming a through hole 500 in a portion opposed to the anode Ax of each partition 200 and forming the cathodes B1, B2, B3, B4 ... Bx and the conductor film 400 on the partition 200, apart of materials thereof enters the through hole 500 to electrically connect the conductor film and the anode Ax, whereby the conductor film 400 is connected to the bias circuit 50 (see FIGS. 1 and 2) which is commonly connected and supplies the bias voltage Vr. Thus, the structure can be simplified.

Consequently, the capacitor Cxx can be obtained between the conductor film 400 and the anodes A1, A2, A3 ... Ax-1 on the partition 200.

Note that the partition 200 is sandwiched by the anodes A1, A2, A3 ... Ax in almost all the portions thereof and, for example, the capacitor Cxx, which is obtained between a conductor film 400a and the anodes A1, A2, A3 ... Ax on a partition 200a located between the cathode B1 and the cathode B2, becomes the capacitor Cxx which affects both a group of the pixels E11, E21, E31 ... formed of the anodes A1, A2, A3 ... and the cathode B1 and a group of the pixels E12, E22, E32 ... formed of the anodes A1, A2, A3 ... and the cathode B2.

Therefore, in the case in which such a structure is adopted, a structure in which the pixel Exx and the capacitor Cxx corresponds one to one as shown in FIGS. 1 and 2 is not realized. Consequently, it is necessary to set a sum of the added capacity Cr of the capacitor Cxx to be equal to or more than a sum of the parasitic capacity Cel for the Exx, and more preferably to be relatively larger taking into account the number of pixels Exx which are affected by the capacitor Cxx.

The present invention can be realized not only in the above-mentioned OLED for performing so-called passive matrix display but also in an OLED for performing segment display as long as the present invention can be applied to the OLED in the same manner and the OLED has anodes and cathodes opposed to each other and an organic layer having at least light-emitting layer intervening between both the poles, and presents light emission with the opposed portions as pixels by providing a capacitor having a predetermined added capacity to which a bias voltage in a direction of canceling charges to be charged to a parasitic capacity of the pixels.

INDUSTRIAL APPLICABILITY

As described above, in the present invention, reduction of a light emission time according to setting of a reset time or a charging time required by the related art is eliminated, and a light emission peak luminance falls. In addition, a light emission rising characteristic is improved to have better linearity for gradation, and marketability is improved. Further, it becomes unnecessary to add a special timing circuit to a drive sequence, and a drive circuit can be reduced in size and simplified. Thus, provision of a drive circuit which can extend the life of the OLED with a simple structure can be realized.

What is claimed is:

1. A drive circuit for an organic light-emitting diode which has anodes and cathodes opposed to each other and an organic layer having at least a light-emitting layer intervening between both the poles, and presents light emission with the opposed portions as pixels, characterized in that capacitors having a predetermined added capacity, to which a bias voltage is applied in a direction of canceling charges to be charged to a parasitic capacity of the pixels, are provided.

2. A drive circuit for an organic light emitting diode which has plural anodes and plural cathodes intersecting while being opposed to each other and an organic layer having at least a light-emitting layer intervening between both the poles, sets one of both the poles as drive lines and the other of both the poles as scanning lines, and by scanning all of these scanning lines as one field at a predetermined frequency, while sequentially bringing any one of the scanning lines into a selected state, in synchronization with this, connects a drive source to the other of the scanning lines to thereby present light emission with the intersection portions as pixels, characterized in that capacitors having a predetermined added capacity, to which a bias voltage is applied in a direction of canceling charges to be charged to a parasitic capacity of the pixels, are provided.

3. A drive circuit for an organic light emitting diode which has plural anodes and plural cathodes intersecting while being opposed to each other and an organic layer having at least a light-emitting layer intervening between both the poles, sets one of both the poles as drive lines and the other of both the poles as scanning lines, has a partition for insulating the scanning lines from each other with a dielectric material on at least one of both the poles, and by scanning all of these scanning lines as one field at a predetermined frequency, while sequentially bringing any one of the scanning lines into a selected state, in synchronization with this, connects a drive source to the other of the scanning lines to thereby present light emission with the intersection portions as pixels, characterized in that capacitors having a predetermined added capacity, to which a bias voltage is applied in a direction of canceling charges to be charged to a parasitic capacity of the pixels between a conductor film formed on the partition and the one of both the poles, are provided.

4. A drive circuit for an organic light emitting diode according to claim 3, characterized in that the conductor film is connected to a bias circuit which is commonly connected to supply the bias voltage.

5. A drive circuit for an organic light emitting diode according to any one of claims 1 to 3, characterized in that the sum of the added capacity is equal to or more than the parasitic capacity.

6. A drive circuit for an organic light emitting diode according to any one of claims 1 to 3, characterized in that the drive source performs a DC current or DC voltage drive, and the bias voltage is a DC voltage.

* * * * *

UNITED STATES PATENT AND TRADEMARK OFFICE
CERTIFICATE OF CORRECTION

PATENT NO. : 6,803,729 B2
DATED : October 12, 2004
INVENTOR(S) : Junichi Maruyama It is certified that error appears in the above-identified patent and that said Letters Patent is hereby corrected as shown below:

<u>Title page,</u>
Item [54], Title, change "DRIVE CIRCUIT FOR ORGANIC EL DEVICE" to
-- DRIVE CIRCUIT FOR ORGANIC LIGHT EMITTING DIODE --.

Signed and Sealed this

Nineteenth Day of April, 2005

JON W. DUDAS
*Director of the United States Patent and Trademark Office*